United States Patent
Wirth (10) Patent No.: US 7,884,383 B2
(45) Date of Patent: Feb. 8, 2011

(54) RADIATION EMITTING SEMICONDUCTOR CHIP

(75) Inventor: Ralph Wirth, Pettendorf-Adlersberg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 11/528,071

(22) Filed: Sep. 26, 2006

(65) Prior Publication Data

US 2007/0081571 A1 Apr. 12, 2007

(30) Foreign Application Priority Data

Sep. 29, 2005 (DE) .................... 10 2005 046 698
Feb. 1, 2006 (DE) .................... 10 2006 004 591

(51) Int. Cl.
*H01L 33/00* (2010.01)

(52) U.S. Cl. .................... 257/98; 257/13; 257/14; 257/79; 257/103; 257/E33.068; 257/E33.069; 257/E33.072; 372/7; 372/43.01; 372/81; 372/99

(58) Field of Classification Search ............ 372/99, 372/7, 43.01, 81; 257/13, 14, 79, 98, 103, 257/E33.068, E33.069, E33.072
See application file for complete search history.

(56) References Cited

U.S. PATENT DOCUMENTS

| | | | | |
|---|---|---|---|---|
| 5,132,750 A * | 7/1992 | Kato et al. | .................... | 257/96 |
| 5,666,373 A * | 9/1997 | Sharp et al. | .................... | 372/18 |
| 5,793,062 A * | 8/1998 | Kish et al. | .................... | 257/98 |
| 6,455,343 B1 | 9/2002 | Chen et al. | | |
| 6,549,556 B1 | 4/2003 | Hwang et al. | | |
| 6,611,543 B2 * | 8/2003 | Hwang | .................... | 372/50.11 |
| 6,697,413 B2 * | 2/2004 | Hwang et al. | ................. | 372/96 |
| 7,256,483 B2 * | 8/2007 | Epler et al. | ................. | 257/676 |
| 7,283,577 B2 * | 10/2007 | Schmid et al. | ................ | 372/99 |
| 2004/0079967 A1 | 4/2004 | Shakuda et al. | | |
| 2005/0104078 A1 | 5/2005 | Cheng et al. | | |
| 2005/0226299 A1 * | 10/2005 | Horng et al. | ............... | 372/50.1 |
| 2005/0247950 A1 * | 11/2005 | Nakamura et al. | ............ | 257/98 |
| 2006/0202105 A1 * | 9/2006 | Krames et al. | ........... | 250/208.1 |
| 2006/0220031 A1 * | 10/2006 | Krames et al. | ................ | 257/79 |

FOREIGN PATENT DOCUMENTS

DE    10 2004 057 802 A1    6/2006

OTHER PUBLICATIONS

Horng et al Wafer-Bonded AlGaInP/Au/AuBe/SiO2/Si Light-Emitting Diodes, The Japan Society of Applied Physics, vol. 39 (2000) pp. 2357-2359.*

(Continued)

*Primary Examiner*—Minsun Harvey
*Assistant Examiner*—Yuanda Zhang
(74) *Attorney, Agent, or Firm*—Cohen Pontani Lieberman & Pavane LLP (57) ABSTRACT

A radiation-emitting semiconductor chip (1) comprising a thin-film semiconductor body (2) which has a semiconductor layer sequence with an active region (4) suitable for generating radiation, and a reflector layer (5) arranged on the thin-film semiconductor body. The semiconductor chip has a Bragg reflector in addition to the reflector layer, and the Bragg reflector (6) and the reflector layer are arranged on the same side of the active region.

17 Claims, 2 Drawing Sheets

OTHER PUBLICATIONS

I. Schnitzer et al., "30% external quantum efficiency from surface textured, thin-film light-emitting diodes", Applied Physics Letters, vol. 63, No. 16, pp. 2174-2176, Oct. 18, 1993.

J.K. Kim et al., "GaInN light-emitting diode with conductive omindirectional reflector having a low-refractive-index indium-tin oxide layer", Applied Physics Letters, vol. 88, pp. 013501-1 to 013501-3, 2006.

J.K. Kim et al., GaInN light-emitting diodes with $RuO_2/SiO_2/Ag$ omni-directional reflector, Applied Physics Letters, vol. 84, No. 22, pp. 4508-4510, May 31, 2004.

* cited by examiner

FIG 2

RADIATION EMITTING SEMICONDUCTOR CHIP

RELATED APPLICATION

This patent application claims the priority of German patent application no. 10 2005 046 698.2 filed Sep. 29, 2005 and 10 2006 004 591.2 filed Feb. 1, 2006, the disclosure content of which is hereby incorporated by reference.

FIELD OF THE INVENTION

The present invention relates to a radiation-emitting semiconductor chip with an active region suitable for generating radiation.

SUMMARY OF THE INVENTION

The extraction efficiency of such a semiconductor chip, i.e. the ratio of the radiation power generated in the active region to the radiation power extracted from the chip is of special significance to the efficiency of such semiconductor chips.

It is an object of the present invention to specify a semiconductor chip which is efficient, especially with regard to the extraction, and can be produced in a simplified manner.

This and other objects are attained in accordance with one aspect of the present invention directed to a radiation-emitting semiconductor chip comprising a thin-film semiconductor body which has a semiconductor layer sequence with an active region suitable for generating radiation, and a reflector layer arranged on the thin-film semiconductor body. In addition to the reflector layer, the semiconductor chip has a Bragg reflector, the Bragg reflector and the reflector layer being arranged on the same side of the active region.

The Bragg reflector and the reflector layer can reflect the radiation generated in the active region. The Bragg reflector or, as an alternative, the reflector layer is preferably partially transparent for the radiation generated in the active region, so that radiation can pass through the respective partially transparent reflector. This radiation reaches the one of the two reflectors which is remote from the active region and can be reflected there. The Bragg reflector is preferably arranged between the active region and the reflector layer since the Bragg reflector can be monolithically integrated in the semiconductor layer sequence of the thin-film semiconductor body which, for example, has been grown epitaxially on a growth substrate.

The thin-film semiconductor body is preferably arranged on a carrier, the reflector layer being arranged in a particularly preferred manner between the carrier and the thin-film semiconductor body. The carrier advantageously mechanically stabilizes the thin-film semiconductor body. The reflector layer can be applied to the thin-film semiconductor body. The Bragg reflector is preferably arranged between the active region and the carrier.

The two reflectors—the reflector layer and the Bragg reflector—reduce the penetration of radiation to the side of the two reflectors facing away from the active region. Thus, the absorption of radiation in elements arranged on this side of the reflectors, e.g. an absorbing carrier, can be reduced. As a consequence, the extraction efficiency of the semiconductor chip is increased. Furthermore, the proportion of radiation power extracted from the semiconductor chip via a surface of the thin-film semiconductor body facing away from the reflectors is increased by reflection of the radiation on the two reflectors. Thus, the radiant exitance of the semiconductor chip from this surface can be increased in a simplified manner. Radiant exitance is understood to be the radiation power emerging from the surface in watts per area of the surface in square meters.

Since the semiconductor chip has two reflectors, the Bragg reflector and the reflector layer, the individual reflectors can be produced with reduced expenditure without significantly reducing the extraction efficiency of the semiconductor chip compared with a semiconductor chip having precisely one individual reflector on one side of the active region. A high extraction efficiency requires the highest possible reflectivity of an individual reflector, e.g. 95% or more, and an associated laborious implementation of this reflector.

For a highly reflective Bragg reflector, e.g. with a reflectivity of more than 95% for vertical radiation incidence, a multiplicity of layers arranged above one another, which form the Bragg reflector, must be provided, as a rule. The reflectivity of the Bragg reflector can be adjusted via the number of layers. The number of layers needed for a predetermined reflectivity increases in a highly nonlinear manner with increasing predetermined reflectivity. The greater the number of layers, however, the higher the production expenditure and the higher the production costs, e.g. due to the extended epitaxy times.

Since, according to an embodiment of the invention, two reflectors are provided, the Bragg reflector and the reflector layer can be formed with comparatively low individual reflectivities. The comparatively low individual reflectivity of the first reflector can be compensated for at least partially by reflection at the second reflector, the Bragg reflector or the reflector layer, respectively. The total reflectivity of the two reflectors can reach values in the range of the reflectivity of a highly reflective individual reflector with advantageously little expenditure. Accordingly, the semiconductor chip can be produced inexpensively and in a simplified manner with high extraction efficiency.

The Bragg reflector can have a reflectivity of 90% or less, preferably 80% or less, particularly preferably 70% or less, for the radiation generated in the active region. Such reflectivities can be achieved with reasonable expenditure and comparatively inexpensively. The reflector layer, too, can have corresponding reflectivities. Furthermore, the reflectivity of the Bragg reflector is preferably 50% or greater, particularly preferably 60% or greater. The reflector layer preferably has a reflectivity of 70% or greater, particularly preferably 80% or greater.

The overall reflectivity of a "cumulative reflector" comprising the two reflectors is preferably 80% or greater, particularly preferably 90% or greater or particularly 95% or greater.

In a preferred embodiment, the reflector layer contains a metal. A metal-containing reflector layer is characterized by reduced dependence of the reflectivity on the angle of incidence of the radiation with respect to the normal to the surface of the reflector layer, compared with a Bragg reflector. Even at comparatively large angles with respect to the normal to the surface of the reflector layer, radiation impinging upon the latter can thus be reliably reflected. In particular, radiation passing through the Bragg reflector which exhibits to an increased extent proportions with comparatively large angles of incidence, can be reflected essentially independently of the angle of incidence.

The reflector layer is preferably essentially constructed to be metallic or contains an alloy which contains at least one metal. Suitable metals are e.g. Au, Al, Ag or Pt, suitable alloys which preferably contain at least one of the abovementioned metals are e.g. AuGe or AuSn. A metal-containing reflector layer can be applied to the thin-film semiconductor body, for example by means of vapor deposition.

Furthermore, the reflector layer is preferably constructed to be electrically conductive. In this case, the semiconductor chip can be electrically contacted in a simplified manner by means of the reflector layer. The reflector layer is expediently connected electrically conductively to the active region for this purpose.

The Bragg reflector is preferably constructed to be doped so that, due to the increased conductivity, the Bragg reflector can also be involved in a simplified manner in the electrical contact connection of the semiconductor chip. Charge carriers for radiation generation by means of charge carrier recombination in the active region can be guided to the active region via the Bragg reflector and the reflector layer.

In a further preferred embodiment, the reflector layer is connected electrically conductively to the thin-film semiconductor body over a large area, particularly the complete area and/or directly. Thus, a large-area charge carrier injection into the active region via the reflector layer is facilitated. In consequence, the radiation power generated in the semiconductor chip can be increased in a simplified manner due to the advantageously large injection area.

In a further preferred embodiment, a semiconductor contact layer is arranged between the reflector layer and the Bragg reflector. The semiconductor contact layer makes it possible to optimize the electrical contact characteristics between the reflector layer and the thin-film semiconductor body which preferably immediately adjoins the reflector layer. In this manner, an ohmic contact, which is in particular essentially free of barrier, can be formed in a simplified manner between the reflector layer and the thin-film semiconductor body. Compared with the layers of the Bragg reflector, the semiconductor contact layer can be chosen more freely. The Bragg reflector preferably immediately adjoins the semiconductor contact layer.

However, a reflector layer which is suitable for forming an electrical contact to the thin-film semiconductor body is not necessarily characterized by high reflectivities for the radiation generated. Due to the additional Bragg reflector, the reflector layer can be optimized in a simplified manner with respect to electrical contact characteristics without significantly reducing the extraction efficiency of the semiconductor chip, e.g. because of a comparatively low reflectivity of the contact-forming reflector layer.

Furthermore, the reflector layer, due to the additional Bragg reflector, can be constructed in a simplified manner optimized with respect to other or alternative functions without significant reduction in efficiency. For example, the reflector layer can be constructed as connection layer by means of which the thin-film semiconductor body is mounted on the carrier, preferably in a mechanically stable manner. The connection layer can be optimized with regard to suitable mounting characteristics, for example the adhesive strength on the carrier and/or on the thin-film semiconductor body. For example, the connection layer is constructed as solder layer.

If the reflector layer is constructed as a connection layer, it preferably immediately adjoins the carrier and/or the thin-film semiconductor body. Elaborate bond metallizations for attaching the thin-film semiconductor body on the carrier additionally to the reflector layer can be advantageously omitted. Accordingly, the thin-film semiconductor body can be mounted on the carrier by means of a single layer which is constructed as a reflector layer and a connection layer.

In a further preferred embodiment, the distance of the active region from the Bragg reflector is greater than the distance of the active region from a surface of the thin-film semiconductor body facing away from the Bragg reflector or the carrier.

The proportion of radiation power extracted directly, i.e. without total reflection in the thin-film semiconductor body or reflection on one of the two reflectors, from the thin-film semiconductor body via the surface of the thin-film semiconductor body facing away from the reflectors can thus be increased.

In a further preferred embodiment, the semiconductor chip is operated in resonator-free fashion, in particular not as laser or RCLED (Resonant Cavity Light Emitting Diode), or the semiconductor chip is provided for resonator-free operation, respectively. Furthermore, the semiconductor chip can be constructed for generating incoherent radiation, in particular as an LED chip.

In case of semiconductor chips with a resonator, for example a laser chip for generating coherent radiation or an RCLED for generating incoherent radiation, only a comparatively small part-area of a surface of the chip is frequently used for emission. In case of an LED chip without a resonator, in contrast, essentially the entire surface of the semiconductor body facing away from the Bragg reflector or the reflector layer can be advantageously utilized for emission.

In the context of the invention, the thin-film semiconductor body used can be regarded as a semiconductor body which is free of a manufacturing substrate on which the semiconductor layer sequence of the thin-film semiconductor body is produced. During the production of the semiconductor layer sequence by epitaxial growth, the manufacturing substrate is given by the growth substrate, for example. The carrier of the thin-film semiconductor body which preferably mechanically stabilizes the latter differs from the manufacturing substrate. As a rule, a substrate for producing a semiconductor layer sequence is subject to high demands, e.g. on the crystal surface of the growth substrate offered for the growth. Since the carrier of the thin-film semiconductor body differs from the manufacturing substrate, it can be selected comparatively freely without having to have the characteristics required for the production of the semiconductor layer sequence. For example, the carrier can be selected to be optimized with regard to thermal or electrical conductivity. The efficiency of the semiconductor chip can thus be enhanced.

In a preferred embodiment, the manufacturing substrate, on which the semiconductor layer sequence for the thin-film semiconductor body is produced, is removed, e.g. detached, from the semiconductor layer sequence. In a particularly preferred manner, the semiconductor layer sequence is arranged and mounted on the carrier before detaching the manufacturing substrate. Thus, the manufacturing substrate can be removed from the semiconductor layer sequence without increasing the risk of damaging the semiconductor layer sequence, the mechanical stability of the semiconductor layer sequence being guaranteed by the carrier. Etching, water jet cutting or a laser ablation method, for example, are suitable for removing the manufacturing substrate.

The reflector layer is preferably applied, e.g. vapor deposited, to the surface of the semiconductor layer sequence facing away from the manufacturing substrate before the manufacturing substrate is removed from the semiconductor layer sequence.

A connection layer can be formed between the semiconductor layer sequence and the carrier for the purpose of mounting on the carrier. This connection layer is preferably metal-containing, e.g. a solder layer. As already mentioned above, the connection layer can also be used as a reflector layer of the semiconductor chip. As an alternative, the connection layer can be provided in addition to the reflector layer. In this case, the reflector layer is preferably arranged between the connection layer and the thin-film semiconductor body.

A radiation-emitting semiconductor chip with a Bragg reflector and an additional reflector layer, both of which are arranged on the same side of the active region, emits an advantageously high proportion of radiation power, generated in the active region, via the surface of the thin-film semiconductor body facing away from the reflectors. The radiance, i.e. the emitted radiation power in watts (W) per solid angle in steradian (sr) and per an emission area, visible from the receiver of the radiation, of the semiconductor chip in square meters ($m^2$) can thus be increased in a simplified manner. In this context, the emission profile of the semiconductor chip, i.e. the angle dependence of the radiated radiation power is preferably essentially unchanged compared with a semiconductor chip in which the Bragg reflector has been omitted. Although the Bragg reflector nominally has the highest reflectivity in the area around its normal to the surface so that a concentration of the emerging radiation power could be expected in the area around the normal to the surface, the reflected radiation, after reflection on the Bragg reflector, is widened by refraction in the semiconductor body so that the emission profile of the radiation extracted from the semiconductor chip is not changed essentially due to the additional Bragg reflector.

Furthermore, the Bragg reflector preferably reflects radiation within an extraction cone directed to the Bragg reflector and coming from the active region, particularly from a center of the active region. The extraction cone is a cone, the aperture angle of which from the active region in direction of the Bragg reflector is equal to twice the critical angle for the total reflection for the radiation emission from the semiconductor chip. Radiation extending outside an extraction cone is subject to a continued total reflection in the semiconductor body and, therefore, does not contribute to the extracted radiation power, or only to a very little extent.

A thin-film semiconductor chip, i.e. a semiconductor chip with a thin-film semiconductor body which is arranged on a carrier can be also characterized by at least one of the following features:

on a main area facing the carrier, of a radiation-generating epitaxial layer sequence, a reflecting layer is applied or constructed which reflects back into the epitaxial layer sequence at least a part of the electromagnetic radiation generated in the latter;

the epitaxial layer sequence has a thickness in the range of 20 µm or less, particularly in the range of 10 µm; and/or the epitaxial layer sequence contains at least one semiconductor layer having at least one area which has a structure of intermixture which, in the ideal case, leads to an approximately ergodic distribution of the light in the epitaxial layer sequence, i.e. it has a stochastic scattering characteristic which is as ergodic as possible.

A basic principle of a thin-film light-emitting diode chip is described, for example, in I. Schnitzer et al., Appl. Phys. Lett. 63 (16), 18 Oct. 1993, 2174-2176, the content of which is herewith incorporated by reference.

A thin-film semiconductor chip comprising a reflector layer between the thin-film semiconductor body and the carrier emits radiation essentially via the surface of the thin-film semiconductor body facing away from the carrier. Due to the additional Bragg reflector which is arranged on the same side of the active region as the reflector layer, a reflector layer of comparatively small reflectivity can be used without significantly reducing the radiation power extracted via the surface of the thin-film semiconductor body facing away from the carrier. Furthermore, the radiation characteristic of the thin-film semiconductor chip is not or not significantly modified compared with that of a thin-film chip having a highly reflective reflector layer, in spite of the Bragg reflector provided.

Figure 1:
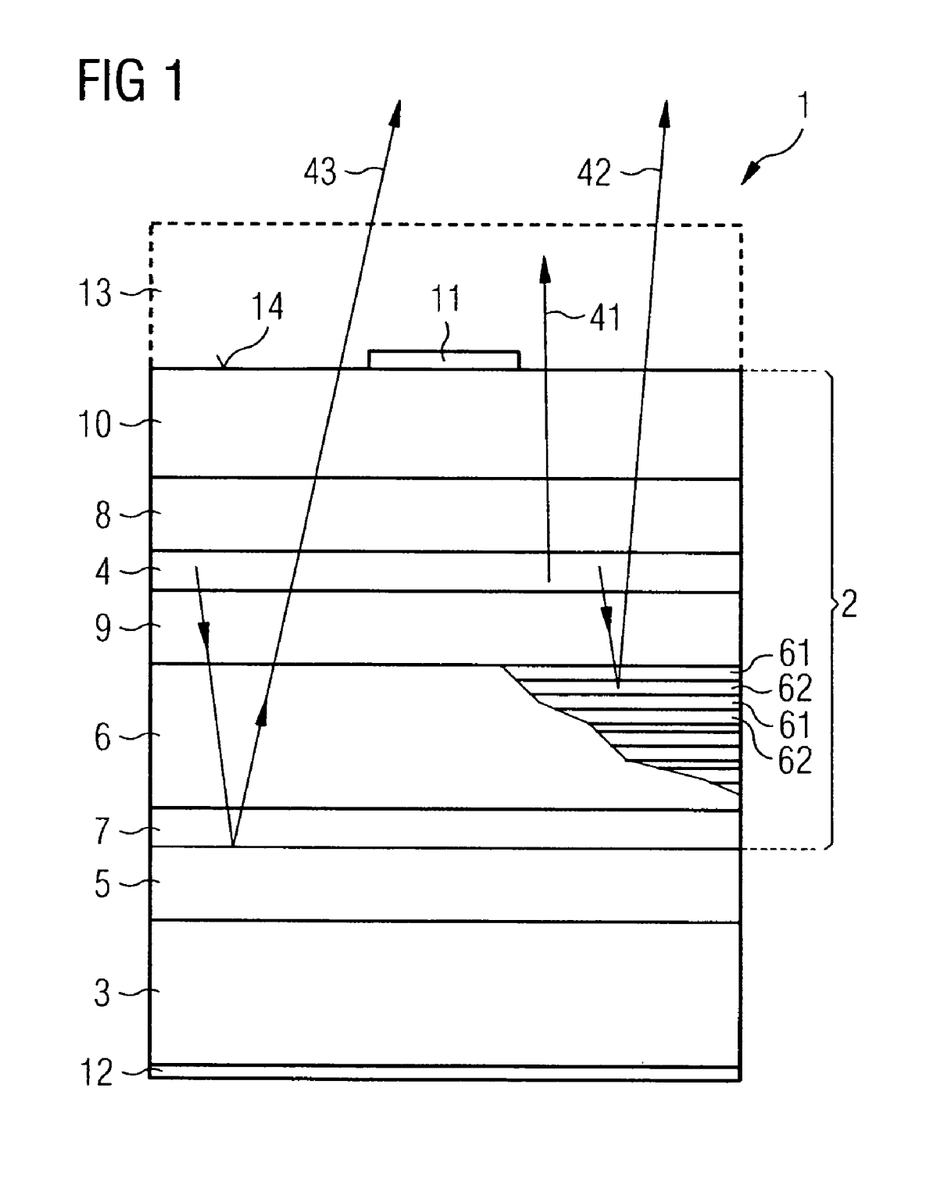
FIG. 1 shows a diagrammatic sectional view of a first exemplary embodiment of a radiation-emitting semiconductor chip according to the invention.

The radiation-emitting semiconductor chip 1 comprises a thin-film semiconductor body 2 which is arranged on a carrier 3. The thin-film semiconductor body 2 has a semiconductor layer sequence with an active region 4 suitable for generating radiation. Between the thin-film semiconductor body 2 and the carrier 3, a reflector layer 5 is arranged. In addition to the reflector layer, a Bragg reflector 6 is monolithically integrated in the thin-film semiconductor body 2 between the reflector layer 5 and the active region 4. Furthermore, a semiconductor contact layer 7 is arranged between the Bragg reflector 6 and the reflector layer 5.

The active region 4 is formed between a first cladding layer 8 and a second cladding layer 9, the first cladding layer being arranged on the side of the active region 4 facing away from the Bragg reflector 6 and the second cladding layer being arranged between the active region 4 and the Bragg reflector 6.

On the side of the active region 4 opposite to the Bragg reflector 6, a current spreading layer 10 is arranged which is preferably monolithically integrated in the thin-film semiconductor body 2. The current spreading layer 10 preferably closes off the thin-film semiconductor body 2 on its side facing away from the Bragg reflector 6. On the side of the reflector layer 5, the thin-film semiconductor body 2 is preferably bounded by the semiconductor contact layer 7.

On the side of the thin-film semiconductor body 2 facing away from the reflector layer 5, a first terminal 11 is arranged which, together with a second terminal 12 arranged on the side of the carrier 3 facing away from the thin-film semiconductor body 2 is provided for the external electrical contacting of the semiconductor chip 1. The first terminal 11 can be provided for a bonding wire connection and the second terminal 12 can be provided for a solder connection for the electrical contact connection of the semiconductor chip.

From the thin-film semiconductor body 2, a growth substrate 13 is removed on which the semiconductor layer sequence for the thin-film semiconductor body has been epitaxially grown. The growth substrate of the semiconductor layer sequence which can form the thin-film semiconductor body is removed, particularly detached, from the semiconductor layer sequence. Suitable methods for the removal are e.g. etching, water jet cutting or a laser stripping process.

Before the growth substrate 13 is removed, the semiconductor layer sequence for the thin-film semiconductor body 2 is preferably arranged and mounted on the carrier 3 which differs from the growth substrate. The carrier 3 stabilizes the thin-film semiconductor body 2 mechanically even after the growth substrate 13 has been removed. The semiconductor layer sequence for the thin-film semiconductor body 2 is expediently arranged on the carrier with its side facing away from the growth substrate. The growth substrate 13 which was removed is indicated in FIG. 1 in dashed fashion.

The reflector layer 5 is preferably applied, e.g. vapor deposited, to the side of the semiconductor layer sequence facing away from the growth substrate 13 before the semiconductor layer sequence is arranged on the carrier 3. Compared with the growth substrate 13, the carrier 3 can be selected comparatively freely, for example optimized with regard to thermal and/or electrical conductivity. A thin-film semiconductor chip having the thin-film semiconductor body 2 arranged on the carrier 3 is thus particularly suitable for forming an efficient radiation-emitting semiconductor chip.

The Bragg reflector 6 preferably comprises a plurality of semiconductor layer pairs which in each case have a first semiconductor layer 61 and a second semiconductor layer 62. These semiconductor layers preferably have an advantageously high difference in refractive index so that the number of semiconductor layer pairs required for achieving a predetermined reflectivity of the Bragg reflector is advantageously small. Furthermore, the semiconductor layers are preferably constructed as $\lambda/4$ layers for the radiation of wavelength $\lambda$ generated in the active region. The semiconductor layers 61 and 62 of different semiconductor layer pairs are expediently arranged alternatingly in the Bragg reflector 6.

The first and the second terminal 11 and 12, respectively, which, for example, in each case contain a metal or are formed as metallization, are electrically conductively connected to the active region 4 so that charge carriers are injected via these terminals into the active region and can recombine therein, thereby generating radiation.

The reflective layer 5 and/or the carrier 3 are preferably constructed to be electrically conducting in order to facilitate the electrical contacting of the semiconductor chip 1. For this purpose, the reflector layer is preferably constructed to be metallic or contains an alloy. Suitable metals are, e.g., Au, Al, Ag, Pt, suitable alloys are, e.g., AuGe or AuSn.

The layers arranged in the thin-film semiconductor body outside the active region, which is preferably constructed to be intrinsic, i.e. undoped, are preferably doped for increasing the electrical conductivity. In particular, the Bragg reflector is preferably constructed to be doped. Layers arranged between the carrier 3 and the active region 4 preferably have the same type of conduction (n-conducting or p-conducting). This correspondingly preferably applies to the layers arranged on the side of the active region opposite to the reflectors, of the thin-film semiconductor body, wherein the type of conduction particularly preferably changes after the active region has been crossed.

The semiconductor contact layer 7 arranged between the reflector layer 5 and the Bragg reflector 6, which preferably immediately adjoins the reflector layer and particularly preferably the Bragg reflector, is expediently characterized by advantageous characteristics of electrical contact to the electrically conductive reflector layer 5. In particular, the semiconductor contact layer 7 can be constructed in such a manner that a potential barrier between the reflector layer 5 and the thin-film semiconductor body 2 is reduced compared with a thin-film semiconductor body in which the semiconductor contact layer is omitted. The semiconductor contact layer 7 can be constructed to be comparatively thin, e.g. with a thickness of between and including 20 nm and including 100 nm.

The reflector layer 5 is electrically conductively connected to the thin-film semiconductor body, preferably essentially over the whole area and particularly preferably directly. The formation of comparatively elaborate contact patterns, for example elaborate metallization layer sequences, between the thin-film semiconductor body 2 and the reflector layer 5 can thus be omitted. Furthermore, this facilitates supplying the active region with current over a large area, and in the active region 4 a high radiation power can be generated in a simplified manner.

The current spreading layer 10 preferably has a comparatively high transverse conductivity—the conductivity in the lateral direction. Current injected into the thin-film semiconductor body 2 via the first terminal 11, which only covers a comparatively small proportion of the surface 14, can thus be laterally spread in the current spreading layer compared with the area covered by the first terminal, and injected into the active region preferably essentially over the complete area. In this manner, a comparatively large proportion of the active region, particularly essentially the entire active region, can be utilized in a simplified manner for generating radiation even though charge carriers are injected into the thin-film semiconductor body 2 only over a comparatively small area below the first terminal 11 on the side of the surface 14. Due to the current spreading layer 11, the first terminal 11 can be advantageously constructed with a small area in a simplified manner so that the risk of absorption of radiation in the first terminal 11 arranged on the surface 14 of the semiconductor chip 1 is reduced. The current spreading layer 10 integrated monolithically in the thin-film semiconductor body 2 preferably has a thickness of 500 nm or more, e.g. 700 nm or more. The thickness is preferably less than or equal to 5 μm.

Instead of a semiconductor current spreading layer, a layer not monolithically integrated in the thin-film semiconductor body 2 can also be used for spreading current. A current spreading layer which contains an electrically conductive oxide transparent to radiation (TCO—Transparent Conduction Oxide), preferably a metal oxide, e.g. a zinc oxide such as ZnO, or an indium tin oxide, is particularly suitable for this purpose. TCO materials are distinguished by high transparency to radiation and at the same time high transverse conductivity. Such a current spreading layer is preferably doped for increasing the conductivity, for example with Al in the case of a ZnO-containing current spreading layer.

During operation of the semiconductor chip 1, radiation is generated in the active region 4. This is illustrated by the radiation components 41, 42 and 43. The cladding layers 8 and 9 are preferably constructed as barrier layers which confine the charge carriers to the active region 4 and thus increase the probability of radiative recombination of charge carriers in the active region 4.

The radiation component 41 emerges directly from the thin-film semiconductor body 2 via its surface 14 facing away from the reflectors 5 and 6. The radiation component 42 initially impinges on the Bragg reflector 6, is reflected on the latter and leaves the thin-film semiconductor body 2 via the surface 14. The radiation component 43 passes through the Bragg reflector 6, is reflected at the reflector layer 5 and, after again passing through the Bragg reflector, emerges from the thin-film semiconductor body 2 via the surface 14. The surface 14, in particular, forms the main emission surface of the semiconductor chip 1.

Due to the multiplicity of reflectors, the Bragg reflector 6 and the reflector layer 5, the radiant excitance of the semiconductor chip 1 on the surface 14 is advantageously increased. The semiconductor chip is constructed, in particular, as surface-emitting semiconductor chip which emits the greatest proportion of radiation power, particularly 90% or more, via its main emission surface.

By means of the metal-containing reflector layer 5, the reflectivity of which, in contrast to that of the Bragg reflector 6, is widely independent of the angle of incidence of the impinging radiation, radiation components impinging on the reflector layer at comparatively large angles such as, for example, the radiation component 43, can also be directed in the direction of the surface 14 to an increased extent.

Due to the fact that radiation passing through the Bragg reflector 6 can be reflected on the reflector layer 5, the Bragg reflector can be constructed with comparatively little reflectivity, preferably 90% or less, for example between including 70% and including 90% with vertical radiation incidence, i.e. parallel to the normal to the surface of the Bragg reflector, without significantly reducing the extraction efficiency or the radiation power extracted, of radiation, particularly via the surface 14.

The epitaxy times for producing the thin-film semiconductor body 2 with the integrated Bragg reflector 6, and correspondingly the production costs, can thus be reduced. Since the Bragg reflector 6 already reflects a large proportion of the radiation, the reflector layer 5 can also be constructed with a comparatively low reflectivity, preferably 90% or less, for example between 80% inclusive and 90% inclusive, without reducing the efficiency of the semiconductor chip significantly.

The reflector layer 5 can accordingly contain materials or consist of materials which have a comparatively low reflectivity for the radiation generated in the active region 4, such as, for example, Au in the green spectral band. The degrees of freedom during the selection of materials for the reflector layer 5 are thus advantageously increased.

The reflector layer 5 can thus be formed such as to have optimized characteristics of electrical contact to the thin-film semiconductor body 2 and/or the reflector layer 5 can thus be formed as a connection layer, by means of which the thin-film semiconductor body is mounted on the carrier 3 in a particularly simple manner.

For this purpose, the reflector layer 5 preferably adjoins the thin-film semiconductor body 2 and the carrier 3 directly, particularly over the complete area. The reflector layer 5 is constructed, for example, as solder layer, for example an AuSn layer, or as an alloyed contact metallization, such as an AuGe layer.

Since such layers are suitably optimized with regard to the mounting characteristics for a connection layer or the electrical contact characteristics for a contact-forming layer, they have, as a rule, a comparatively low reflectivity for the radiation generated in the active region. In the context of the invention, this can be compensated for at least partially by the Bragg reflector. Since the reflector layer can also be used as connection layer at the same time, the semiconductor chip can be produced in a simplified and cost-effective manner compared with a separate construction of a reflector layer and a connection layer whilst still exhibiting a high extraction efficiency.

In a preferred embodiment of the invention, the thin-film semiconductor body, particularly the active region, the Bragg reflector, the semiconductor contact layer and/or the current spreading layer, contains a III-V semiconductor material, particularly preferably a material from the III-V semiconductor material systems $In_xGa_yAl_{1-x-y}P$, with $0 \leq x \leq 1$, $0 \leq y \leq 1$ and $x+y \leq 1$, preferably $y \neq 0$ and/or $y \neq 1$, $In_xGa_yAl_{1-x-y}As$, with $0 \leq x \leq 1$, $0 \leq y \leq 1$ and $x+y \leq 1$, preferably $y \neq 0$ and/or $y \neq 1$ and/or $In_xGa_yAl_{1-x-y}N$, with $0 \leq x \leq 1$, $0 \leq y \leq 1$ and $x+y \leq 1$, preferably $y \neq 0$ and/or $y \neq 1$.

Materials from these III-V systems of materials can be used for producing a semiconductor chip which is particularly efficient for generating radiation. In particular, an active region with high quantum efficiency can be produced. Such materials, particularly from the systems of materials $In_xGa_yAl_{1-x-y}P$ or $In_xGa_yAl_{1-x-y}N$, are particularly suitable for generating radiation from the visible spectral band. The semiconductor chip is preferably constructed for generating visible light, therefore.

Furthermore, the semiconductor chip 1 is preferably constructed as an LED chip for generating incoherent radiation. Furthermore, the semiconductor chip is preferably provided for resonator-free operation and particularly preferably not constructed as a RCLED chip. Thus, an elaborate tuned positioning of the active region in a resonator, which is often required for an efficient operation of a chip with resonator, can be omitted. The active region 4 can be arranged essentially at an arbitrary position within the thin-film semiconductor body 2. The active region—in deviation from the purely schematic representation in FIG. 1, which is not true to scale—is preferably arranged closer to the surface 14 of the thin-film semiconductor body 2 facing away from the reflectors 5 and 6 than to the Bragg reflector 6. The radiation power emerging directly via the surface 14 can thus be increased. One or more of the layers of the thin-film semiconductor body 2 arranged between the reflector layer 5 and the active region 4 are preferably constructed to be correspondingly thick for this purpose.

For a semiconductor chip 1, the active region 4 of which is based on $In_xGa_yAl_{1-x-y}P$, the thin-film semiconductor body 2 can have, for example, the semiconductor layer sequence applied to a GaAs growth substrate 13 in the order listed below:

An n-conducting current spreading layer 10 which contains InGaAlP or AlGaAs. In the latter case, the aluminum content is preferably $\geq 0.5$. As a result, high transverse conductivities can be advantageously achieved.

An n-conducting cladding layer 8 which contains InAlP.

An active region 4 which contains InGaAlP.

A p-conducting cladding layer 9 which contains InAlP.

A Bragg reflector 6 with a multiplicity of semiconductor layer pairs, for example between and including 5 and including 20 semiconductor layer pairs, preferably between 8 and 15 semiconductor layer pairs, particularly preferably 10 pairs, with in each case one first $\lambda/4$ semiconductor layer 61 which contains $Al_{0.5}Ga_{0.5}As$, and a second $\lambda/4$ semiconductor layer 62 which contains $Al_{0.95}Ga_{0.05}As$. The Bragg reflector is expediently formed p-conducting.

On the Bragg reflector, a p-conducting semiconductor contact layer 7 is arranged which is based on $Al_xGa_{1-x}As$, with $0 \leq x \leq 1$. An aluminum content of 0.5 or less has been found to be particularly advantageous for forming an electrical contact. Compared with layers with a higher aluminum content, an oxidation of the layer which can impair the electrical contact characteristics can be reduced or prevented. A semiconductor contact layer 7 of $Al_{0.5}Ga_{0.5}As$ or GaAs is particularly suitable, particularly for forming an electrical contact to AuGe. The semiconductor contact layer 7 is preferably constructed to be comparatively thin, e.g. with a thickness of 100 nm or less.

If necessary, the types of conductivity of the individual layers of the semiconductor body can be exchanged in each case—from n-conducting to p-conducting or vice versa. This is suitable, in particular, if a TCO current spreading layer 10, for example of ZnO:Al, is provided which is particularly suitable for forming a contact to p-conducting material.

Semiconductor materials of the submaterial systems $In_{0.5}(Ga_{1-x}Al_x)_{0.5}P$ and $Al_xGa_{1-x}As$, in each case with $0 \leq x \leq 1$, are characterized by good lattice matching with respect to one another and particularly also with respect to GaAs. Therefore, the semiconductor chip is preferably based on these systems of materials. Layers of these systems of materials can be monolithically integrated in a simplified manner and produced on one another in a simplified manner. A layer of the $Al_xGa_{1-x}As$ system is particularly suitable for a layer forming a contact to metal-containing materials or as a layer for the Bragg reflector. The refractive index of an $Al_xGa_{1-x}As$ layer can be adjusted via the aluminum content x which is of particular significance for the Bragg reflector. This semiconductor layer sequence for the thin-film semiconductor body 2 can be mounted on a Ge carrier 3 by means of an AuGe reflector layer 5 which is formed on the semiconductor contact layer 7. After that, the growth substrate 13 can be removed. AuGe is characterized, on the one hand, by good mounting characteristics, and, on the other hand, by an advantageously high reflectivity, particularly in the wavelength band between and including 560 nm and including 650 nm. The system of materials $In_xGa_yAl_{1-x-y}P$ is particularly suitable for a corresponding active region for generating radiation in this band of wavelengths.

The reflector layer preferably contains a material composition which has an eutectic. The reflector layer is constructed in a particularly preferred manner in eutectic composition. AuGe in eutectic composition is particularly suitable for this purpose. Mounting the thin-film semiconductor body 2 on the carrier 3 is particularly temperature-stable with an eutectic composition of the reflector layer.

Figure 2:
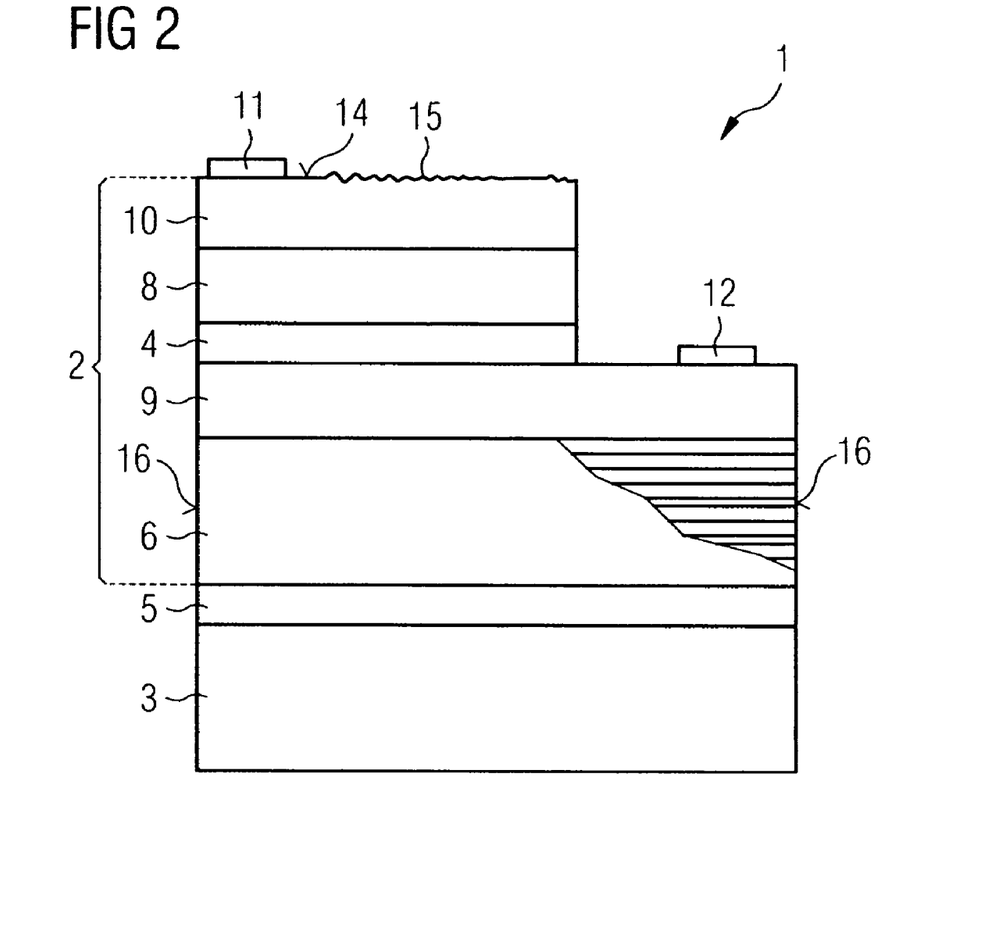
FIG. 2 shows a diagrammatic sectional view of a second exemplary embodiment of a radiation-emitting semiconductor chip according to the invention.

FIG. 2 shows a diagrammatic sectional view of a second exemplary embodiment of a radiation-emitting semiconductor chip according to the invention. The semiconductor chip 1 essentially corresponds to the semiconductor chip explained in connection with FIG. 1.

In contrast thereto, both, the first terminal 11 and the second terminal 12, are arranged on the side of the thin-film semiconductor body 2 facing away from the Bragg reflector 6 and the reflector layer 5. The second terminal 12 is directly connected electrically conductively to the area of the thin-film semiconductor body between the reflector layer 5 and the active region 4. Both, the first terminal 11 and the second terminal 12, are preferably provided for wire bonding. To facilitate an electrically conductive connection of the second terminal 12 to the area of the thin-film semiconductor body 2 arranged between the active region 4 and the reflector layer 5, this area preferably has a lateral extent which is greater than that of the area of the thin-film semiconductor body 2 arranged on the side of the active region 4 opposite of the reflector layer 5. This facilitates the arrangement of the second terminal 12 on a layer of the thin-film semiconductor body 2 between the active region 4 and the Bragg reflector 6, e.g. on the second cladding layer 9.

Since the electrical contacting takes place on the side of the thin-film semiconductor body facing away from the reflector layer 5, construction of the carrier 3 in an electrically insulating manner can be simplified. A semiconductor contact layer 7 as in the exemplary embodiment according to FIG. 1 was omitted since the electrical contacting is not effected via the reflector layer 5 and a good electrical coupling of the reflector layer 5 to the thin-film semiconductor body 2 thus does not entail any significant advantages. The thin-film semiconductor body 2 is bounded on the side of the reflector layer 5 by the Bragg reflector 6 which preferably adjoins the reflector layer 5 directly.

Furthermore, the semiconductor chip 1, in contrast to the exemplary embodiment according to FIG. 1, has an extraction structure 15 which is applied to the surface 14 or which is formed in the surface 14 of the thin-film semiconductor body.

The extraction structure 15 is preferably provided only in the area of the surface 14 which is used as a main emission surface and which is not covered by the first terminal 11. Naturally, a corresponding extraction structure 15 can also be provided in the exemplary embodiment according to FIG. 1.

For example, the extraction structure 15 is constructed as a roughening of the surface 14 of the thin-film semiconductor body 2, for example as a structure formed in the current spreading layer 10. The extraction structure can be used for disturbing the total reflection at the surface 14 and for increasing the radiation power extracted from the thin-film semiconductor body 2 via the surface 14. Such an extraction structure can be generated, for example, by means of etching or by means of a sandblasting process. The side areas 16 of the thin-film semiconductor body 2 are preferably free of an extraction structure so that the total reflection is disturbed selectively only on the surface 14.

The scope of protection of the invention is not limited to the examples given hereinabove. The invention is embodied in each novel characteristic and each combination of characteristics, which particularly includes every combination of any features which are stated in the claims, even if this feature or this combination of features is not explicitly stated in the claims or in the examples.

I claim:

1. A radiation-emitting semiconductor chip comprising:
   a thin-film semiconductor body having a semiconductor layer sequence with an active region suitable for generating radiation;
   a metallic reflector layer arranged on the thin-film semiconductor body;
   a Bragg reflector; and
   a semiconductor contact layer arranged between the metallic reflector layer and the Bragg reflector;
   wherein the Bragg reflector and the metallic reflector layer are arranged on the same side of the active region for reflecting radiation generated in the active region,
   wherein the semiconductor chip is constructed for generating incoherent radiation, and
   wherein the semiconductor chip is free of a growth substrate.

2. The semiconductor chip as claimed in claim 1, wherein the Bragg reflector is integrated monolithically in the semiconductor layer sequence of the thin-film semiconductor body.

3. The semiconductor chip as claimed in claim 1, wherein the thin-film semiconductor body is arranged on a carrier and the metallic reflector layer is arranged between the carrier and the thin-film semiconductor body.

4. The semiconductor chip as claimed in claim 3, wherein the Bragg reflector is arranged between the active region and the carrier.

5. The semiconductor chip as claimed in claim 1, wherein the Bragg reflector is arranged between the active region and the metallic reflector layer.

6. The semiconductor chip as claimed in claim 3, wherein the metallic reflector layer directly adjoins the carrier.

7. The semiconductor chip as claimed in claim 1, wherein the metallic reflector layer directly adjoins the thin-film semiconductor body.

8. The semiconductor chip as claimed in claim 3, wherein the thin-film semiconductor body is mounted on the carrier by means of the metallic reflector layer.

9. The semiconductor chip as claimed in claim 1, wherein the metallic reflector layer is constructed to be electrically conductive.

10. The semiconductor chip as claimed in claim 1, wherein the metallic reflector layer has a reflectivity of 90% or less for radiation to be generated in the active region.

11. The semiconductor chip as claimed in claim 10, wherein the Bragg reflector has a reflectivity of 90% or less for radiation to be generated in the active region.

12. The semiconductor chip as claimed in claim 1, wherein the semiconductor chip is operated in a resonator-free fashion.

13. The semiconductor chip as claimed in claim 1, wherein the distance of the active region from the Bragg reflector is greater than the distance of the active region from a surface of the thin-film semiconductor body facing away from the Bragg reflector.

14. The semiconductor chip as claimed in claim 1, wherein the metallic reflector layer is connected to the thin-film semiconductor body electrically conductively over a large area.

15. The semiconductor chip as claimed in claim 1, wherein the Bragg reflector has a reflectivity of 90% or less for radiation to be generated in the active region.

16. The semiconductor chip as claimed in claim 10, wherein at least one of the Bragg reflector and the metallic reflector layer have a reflectivity of at most 80%.

17. The semiconductor chip as claimed in claim 10, wherein the metallic reflector layer has a reflectivity of 70% or greater for radiation generated in the active region.

* * * * *